US011266045B2

(12) United States Patent
Kajihara

(10) Patent No.: US 11,266,045 B2
(45) Date of Patent: Mar. 1, 2022

(54) POWER CONVERSION DEVICE AND EXHAUST STRUCTURE

(71) Applicant: TOSHIBA MITSUBISHI-ELECTRIC INDUSTRIAL SYSTEMS CORPORATION, Chuo-ku (JP)

(72) Inventor: Yukio Kajihara, Tokyo (JP)

(73) Assignee: TOSHIBA MITSUBISHI-ELECTRIC INDUSTRIAL SYSTEMS CORPORATION, Chuo-ku (JP)

(*) Notice: Subject to any disclaimer, the term of this patent is extended or adjusted under 35 U.S.C. 154(b) by 0 days.

(21) Appl. No.: 16/954,336

(22) PCT Filed: Jul. 3, 2018

(86) PCT No.: PCT/JP2018/025200
§ 371 (c)(1),
(2) Date: Jun. 16, 2020

(87) PCT Pub. No.: WO2020/008523
PCT Pub. Date: Jan. 9, 2020

(65) Prior Publication Data
US 2021/0092873 A1    Mar. 25, 2021

(51) Int. Cl.
*H05K 7/20* (2006.01)
*H05K 7/14* (2006.01)

(52) U.S. Cl.
CPC .......... *H05K 7/20727* (2013.01); *H05K 7/14* (2013.01); *H05K 7/20172* (2013.01); *H05K 7/20181* (2013.01)

(58) Field of Classification Search
CPC .. H05K 7/20727; H05K 7/14; H05K 7/20172; H05K 7/20181; F24F 13/105
See application file for complete search history.

(56) References Cited

U.S. PATENT DOCUMENTS 6,135,875 A * 10/2000 French .................. H02B 1/565
361/695
6,772,534 B2 * 8/2004 Gomes .................. F24F 3/1411
34/210

(Continued)

FOREIGN PATENT DOCUMENTS

JP          11-22698 A    1/1999
JP       2001-317775 A   11/2001

(Continued)

OTHER PUBLICATIONS

International Search Report dated Aug. 28, 2018 in PCT/JP2018/025200 filed on Jul. 3, 2018, citing documents AA, AB and AP-AS therein, 2 pages.

(Continued)

*Primary Examiner* — Mukundbhai G Patel
(74) *Attorney, Agent, or Firm* — Oblon, McClelland, Maier & Neustadt, L.L.P.

(57) ABSTRACT

A power conversion device includes a housing, a power conversion unit, a fan, and a flexible shutter. The shutter is in a sheet shape. The shutter includes an end portion and a movable portion, the end portion being fixed to at least one of the housing and a frame body, the movable portion being movable with respect to the housing. The shutter is configured to be deformed by wind from the fan in a case where the fan is driven and to form a gap through which the wind passes between the shutter and at least one of the housing and the frame body.

10 Claims, 14 Drawing Sheets

(56) References Cited

U.S. PATENT DOCUMENTS

| | | | |
|---|---|---|---|
| 9,888,616 B2* | 2/2018 | Yu | H05K 5/0217 |
| 2004/0240177 A1 | 12/2004 | Suzuki et al. | |
| 2011/0259550 A1* | 10/2011 | Komaba | F16K 15/035 |
| | | | 165/96 |
| 2017/0290197 A1 | 10/2017 | Zhong et al. | |
| 2018/0279506 A1* | 9/2018 | Takasaki | H05K 7/20172 |

FOREIGN PATENT DOCUMENTS

| | | |
|---|---|---|
| JP | 2002-364963 A | 12/2002 |
| JP | 2005-11304 A | 1/2005 |
| JP | 4435718 B2 | 3/2010 |
| JP | 2017-527120 A | 9/2017 |

OTHER PUBLICATIONS

Indian Office Action dated Dec. 21, 2020 in Indian Patent Application No. 202017025587, citing document AO therein, 6 pages.

* cited by examiner

US 11,266,045 B2

POWER CONVERSION DEVICE AND EXHAUST STRUCTURE

TECHNICAL FIELD

Embodiments of the present invention relate to a power conversion device and an exhaust structure.

BACKGROUND ART

A power conversion device including a housing, a power conversion unit accommodated in the housing, and a fan which exhausts air in the housing to the outside of the housing is known.

Incidentally, a case in which a metal shutter is provided for an exhaust port of the housing of the power conversion device may be considered. In this case, a shutter shaft which rotatably supports the shutter may deteriorate over time, and the shutter may not operate as designed in long-term use of the power conversion device.

PRIOR ART LITERATURE

Patent Literature

[Patent Literature 1]
Japanese Unexamined Patent Application, First Publication No. 2001-317775

SUMMARY OF INVENTION

Issue to be Solved by Invention

The issue to be solved by the present invention is to provide a power conversion device and an exhaust structure in which a shutter is able to be easily operated as designed over a long period of time.

Means for Solving the Issue

A power conversion device according to an embodiment includes a housing, a power conversion unit, a fan, and a flexible shutter. The power conversion unit is accommodated in the housing. The fan is accommodated in at least one of: the housing or a frame body attached to the housing, and configured to exhaust air in the housing to the outside of the housing. The shutter is in a sheet shape. The shutter is disposed outside the housing. The shutter is configured to cover the fan. The shutter includes an end portion and a movable portion, the end portion being fixed to at least one of the housing and the frame body, the movable portion being movable with respect to the housing. The shutter is configured to be deformed by wind from the fan in a case where the fan is driven and to form a gap through which the wind passes between the shutter and at least one of the housing and the frame body

MODE FOR CARRYING OUT INVENTION

Figure 1:
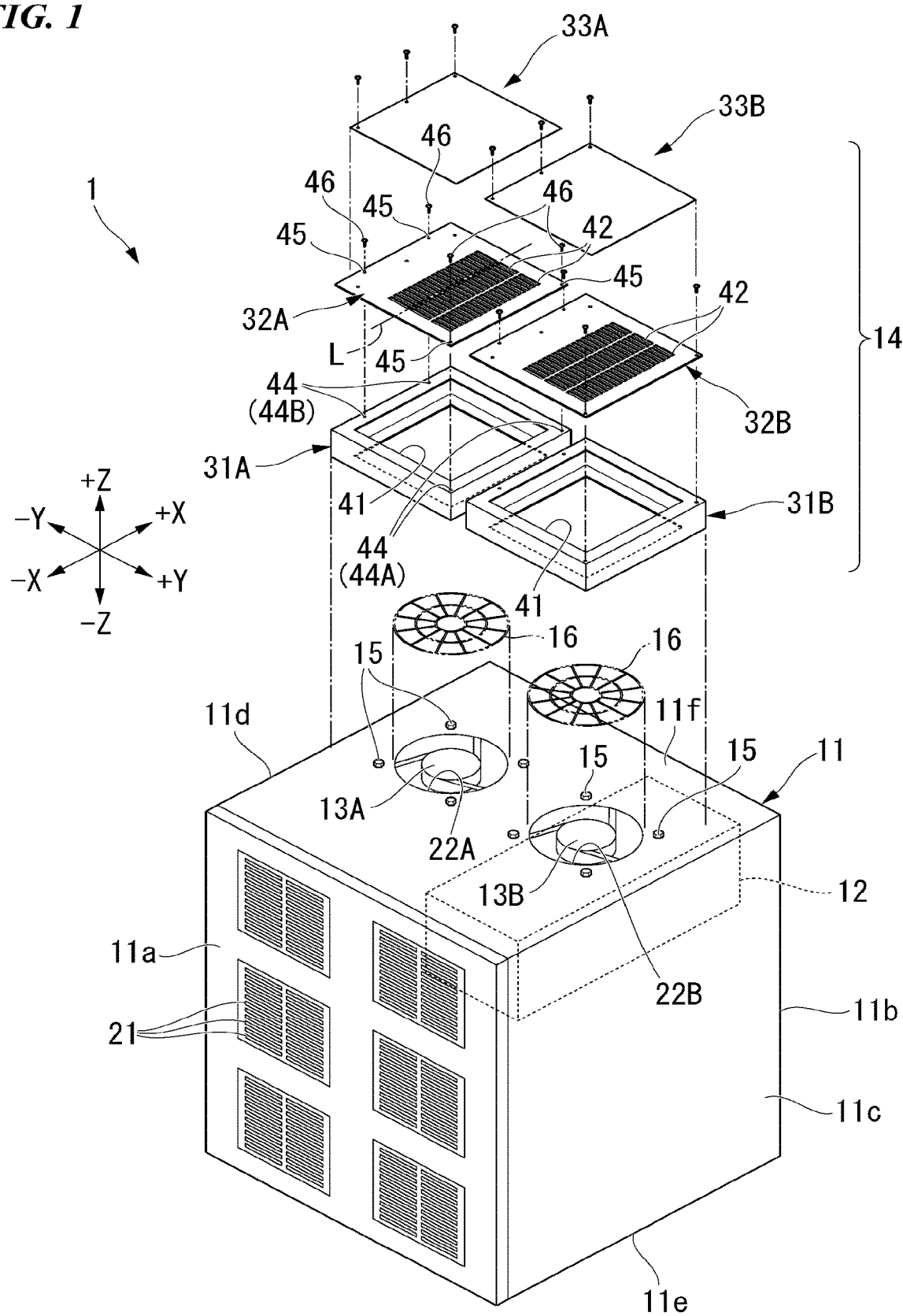
FIG. 1 is a partially exploded perspective view showing a power conversion device according to a first embodiment.

Hereinafter, a power conversion device and an exhaust structure of embodiments are described with reference to drawings. In the following description, the same reference numerals are given to constitutions having the same or similar functions. And, description of constitutions which overlap each other may be omitted. Further, for convenience of explanation, flow guide plates 34A and 34B are not shown in some drawings.

First Embodiment

A power conversion device 1 and an exhaust structure 14 according to a first embodiment will be described with reference to FIGS. 1 to 7. Here, a +X direction, a −X direction, a +Y direction, a −Y direction, a +Z direction, and a −Z direction are defined first. The +X direction, the −X direction, the +Y direction, and the −Y direction are directions along a substantially horizontal plane. The +X direction is a direction from a front wall 11a of a housing 11, which will be described later, toward a rear wall 11b thereof. The −X direction is a direction opposite to the +X direction. When the +X direction and the −X direction are not distinguished, they are simply referred to as "X direction." The +Y direction and the −Y direction are directions different from (for example, substantially orthogonal to) the X direction. The +Y direction is a direction from a first fan 13A, which will be described later, toward a second fan 13B. The −Y direction is a direction opposite to the +Y direction. When the +Y direction and the −Y direction are not distinguished, they are simply referred to as "Y direction." The +Z direction and the −Z direction are directions different from (for example, substantially orthogonal to) the X direction and the Y direction. The +Z direction is a substantially upward vertical direction. The −Z direction is a direction opposite to the +Z direction and is a substantially downward vertical direction. When the +Z direction and the −Z direction are not distinguished, they are simply referred to as "Z direction."

FIG. 1 is a partially exploded perspective view showing the power conversion device 1. The power conversion device 1 is, for example, a drive device which supplies desired power to a load such as a motor. For example, the power conversion device 1 converts AC power supplied from an AC power source into DC power, converts the DC power into AC power having a desired frequency and voltage and supplies the converted AC power to the load. The power conversion device is not limited to the above-described example and may have, for example, at least one of a function in which DC power is converted into AC power and a function in which DC power is converted into AC power.

The power conversion device 1 includes, for example, a housing 11, a plurality of power conversion units 12 (only one is shown in FIG. 1 as a representative), a plurality of fans 13A and 13B, and an exhaust structure 14.

For example, the housing 11 is formed in a box shape. Shelves (not shown) which support the plurality of power conversion units 12 are provided inside the housing 11. The housing 11 includes, for example, a front wall 11a, a rear wall 11b, a first side wall 11c, a second side wall 11d, a lower wall 11e, and an upper wall (a top plate) 11f.

The front wall 11a is located at an end portion of the housing 11 in the −X direction and extends in the Y direction and the Z direction. A plurality of intake holes 21 are provided in the front wall 11a. The plurality of intake holes 21 allow communication between outside of the housing 11 and the inside of the housing 11. When the fans 13A and 13B which will be described later are driven, air outside the housing 11 is led to the inside of the housing 11 through the intake holes 21.

The rear wall 11b is located at an end portion of the housing 11 in the +X direction and extends in the Y direction and the Z direction. The first side wall 11c is located at an end portion of the housing 11 in the +Y direction and extends in the X direction and the Z direction. The second side wall 11d is located at an end portion of the housing 11 in the −Y direction and extends in the X direction and the Z direction. The lower wall 11e is located at an end portion of the housing 11 in the −Z direction and extends in the X direction and the Y direction.

The upper wall 11f is located in an end portion of the housing 11 in the +Z direction and extends in the X direction and the Y direction. A plurality of opening portions 22A and 22B (a first opening portion 22A and a second opening portion 22B) are provided in the upper wall 11f. The plurality of opening portions 22A and 22B are arranged in the Y direction, for example. The plurality of opening portions 22A and 22B pass through the upper wall 11f in the Z direction and allow communication between the inside of the housing 11 and the outside of the housing 11. When the fans 13A and 13B which will be described later are driven, air inside the housing 11 is exhausted to the outside of the housing 11 through the opening portions 22A and 22B.

The plurality of power conversion units 12 are accommodated in the housing 11. The power conversion unit 12 includes, for example, at least one of a converter which converts AC power into DC power and an inverter which converts DC power into AC power. In addition, the power conversion device 1 may include at least one power conversion unit 12. The power conversion unit 12 generates heat when driven.

The plurality of fans 13A and 13B (a first fan 13A and a second fan 13B) are accommodated in the housing 11, for example. At least a part of each of the fans 13A and 13B may protrude outside the housing 11 and may be accommodated in frame bodies 31A and 31B which will be described later. Further, the plurality of fans 13A and 13B may be accommodated in the frame bodies 31A and 31B described later, instead of the housing 11. An example of this case will be described again as a fifth embodiment.

In the embodiment, the plurality of fans 13A and 13B are arranged in the Y direction. Each of the fans 13A and 13B is, for example, an axial flow fan. A rotation center axis C1 (refer to FIG. 3) of each of the fans 13A and 13B extends in the Z direction. Each of the fans 13A and 13B has an intake port 25 which opens in the −Z direction and a discharge port 26 which opens in the +Z direction (refer to FIG. 3). Each of the fans 13A and 13B suctions the air in the housing 11 and discharges the suctioned air in the +Z direction.

In the embodiment, the plurality of fans 13A and 13B are accommodated in an upper end portion of the housing 11. The discharge port 26 of the first fan 13A is disposed corresponding to the first opening portion 22A of the housing 11. The first fan 13A exhausts the suctioned air to the outside of the housing 11 through the first opening portion 22A of the housing 11. On the other hand, the discharge port 26 of the second fan 13B is disposed corresponding to the second opening portion 22B of the housing 11. The second fan 13B exhausts the suctioned air to the outside of the housing 11 through the second opening portion 22B of the housing 11. However, each of the fans 13A and 13B may be a fan which exhausts the air in the housing 11 to the outside of the housing 11, and a constitution and an arrangement position thereof are not limited to the above-described example.

The plurality of fans 13A and 13B are, for example, a pair of fan sets for providing redundancy to the power conversion device 1. Each of the fans 13A and 13B has sufficient performance for cooling the power conversion device 1. The plurality of fans 13A and 13B are operated alternately, for example. In a case where one of the plurality of fans 13A and 13B fails, the remaining one is operated continuously.

Each of the fans 13A and 13B is fixed to the upper wall 11f of the housing 11 by fixing members 15 such as bolts or rivets, for example. At least a part of the fixing member 15 protrudes in the +Z direction from an upper surface of the upper wall 11f.

A fan cover 16 may be attached to each of the fans 13A and 13B. At least a part of the fan cover 16 protrudes in the +Z direction from the upper surface of the upper wall 11f, for example. The fan cover 16 may be omitted when panels 32A and 32B which will be described later are provided.

Next, the exhaust structure 14 will be described. The exhaust structure 14 includes, for example, a plurality of frame bodies 31A and 31B (a first frame body 31A and a second frame body 31B), a plurality of panels 32A and 32B (a first panel 32A and a second panel 32B), a plurality of shutters 33A, 33B (a first shutter 33A and a second shutter 33B), and a plurality of flow guide plates 34A and 34B (a first flow guide plate 34A and a second flow guide plate 34B, refer to FIG. 7).

Here, a set (a first set) of the first frame body 31A, the first panel 32A, the first shutter 33A, and the first flow guide plate 34A, and a set (a second set) of the second frame body 31B, the second panel 32B, the second shutter 33B, and the second flow guide plate 34B have substantially the same constitution and function. Therefore, hereinafter, the first set will be described as a representative. An explanation for the second set is given by replacing the "first frame body 31A" with the "second frame body 31B," replacing the "first panel 32A" with the "second panel 32B," replacing the "first shutter 33A" with the "second shutter 33B," replacing the "first flow guide plate 34A" with the "second flow guide plate 34B," replacing the "first fan 13A" with the "second fan 13B", and replacing the "first opening portion 22A" with the "second opening portion 22B" in the explanation below for the first set. The second set is disposed, for example, in the +Y direction with respect to the first set.

First, the first frame body 31A will be described. The first frame body 31A is disposed outside the housing 11 and is attached to the upper wall 11f of the housing 11 from above. The first frame body 31A is disposed corresponding to the first opening portion 22A of the housing 11. The first frame body 31A is formed in a substantially quadrangular frame body shape which surrounds the first opening portion 22A in a plan view. The first frame body 31A is formed in the frame body shape and thus has the exhaust port 41 which is directed in the +Z direction. The exhaust port 41 faces the first opening portion 22A of the housing 11 in the Z direction.

In the embodiment, a center of the first frame body 31A substantially coincides with the rotation center axis C1 (refer to FIG. 3) of the first fan 13A in the Z direction. The "center of the first frame body 31A" is a position which is substantially equidistant from all corners (for example, four corners) of the first frame body 31A having a polygonal (for example, quadrangular) shape.

The first frame body 31A accommodates, for example, at least a part of the above-described fixing members 15 (the fixing members which fix the first fan 13A to the upper wall 11f of the housing 11) and at least a part of the fan cover 16. Therefore, even when there is a structure (for example, the fixing members 15 and the fan cover 16) which protrudes in the +Z direction from the upper wall 11f, the first shutter 33A can easily cover the first fan 13A in a substantially horizontal posture.

Next, the first panel 32A will be described. The first panel 32A is formed in a plate shape which extends in the X direction and the Y direction. The first panel 32A is formed of a metal or a hard synthetic resin and has rigidity. The first panel 32A is disposed between the first fan 13A and the first shutter 33A. The first panel 32A serves as a support member which supports the first shutter 33A in a substantially horizontal posture when the first fan 13A is not driven. Further, the first panel 32A also serves as a protective member which protects the inside of the power conversion device 1 from, for example, a falling object (for example, a tool or the like when work is performed above thereof) from above. Furthermore, the first panel 32A also serves as a safety member which prevents a user or a worker of the power conversion device 1 from reaching for the first fan 13A by mistake. Moreover, when the first panel 32A is formed of a metal, the first panel 32A also serves as a member for countermeasures against electro-magnetic interference (EMI).

In the embodiment, the first panel 32A is attached to an upper surface of the first frame body 31A and is disposed between the first frame body 31A and the first shutter 33A. The first panel 32A has an outer shape larger than the exhaust port 41 of the first frame body 31A and covers the exhaust port 41 from above. In the embodiment, when the first fan 13A is not driven, the first panel 32A supports the first shutter 33A in a substantially horizontal posture by supporting the first shutter 33A placed on the first panel 32A from below. The definition of "substantially horizontal posture" will be described later together with movement of the first shutter 33A.

The first panel 32A has a plurality of exhaust holes 42. Each of the exhaust holes 42 is smaller than the exhaust port 41 of the first frame body 31A. Each of the exhaust holes 42 is smaller than an assumed falling object (for example, a tool) or a human hand. However, the total opening area of the plurality of exhaust holes 42 is set to be equal to or larger than an opening area of the discharge port 26 of the first fan 13A. In the embodiment, each of the exhaust holes 42 is formed in a slit shape which extends in the Y direction. However, a shape of the exhaust hole 42 is not limited to the above-described example and may be a polygonal shape or a circular shape. Positions of the plurality of exhaust holes 42 will be described later.

In the embodiment, the first panel 32A is formed in a quadrangular shape which follows the outer shape of the first frame body 31A. A center of the first panel 32A substantially coincides with the rotation center axis C1 (refer to FIG. 3) of the first fan 13A in the Z direction. The "center of the first panel 32A" is a position which is substantially equidistant from all corners (for example, four corners) of the first panel 32A having a polygonal (for example, quadrangular) shape.

The first panel 32A has a plurality of screw insertion holes 45. On the other hand, the first frame body 31A has a plurality of screw holes 44 at positions corresponding to the plurality of screw insertion holes 45. The first panel 32A is fixed to the first frame body 31A by inserting a plurality of fixing members 46 into the screw insertion holes 45 and engaging them with the screw holes 44. Here, the plurality of screw insertion holes 45 and the plurality of screw holes 44 are disposed asymmetrically with respect to a center line L of the first panel 32A in the X direction. For example, the plurality of screw holes 44 include two screw holes 44A located in the +Y direction with respect to the center line L, and two screw holes 44B located in the −Y direction with respect to the center line L. Additionally, a distance between the two screw holes 44A is different from a distance between the two screw holes 44B. Therefore, there is regulation such that there is only one installation direction of the first panel 32A with respect to the first frame body 31A. As a result, the first panel 32A is prevented from being installed on the first frame body 31A in a direction different from a normal direction, and as will be described later, the plurality of exhaust holes 42 can be disposed to be biased in a specific direction. However, the embodiment is not limited to the above-described example, and the distance between the two screw holes 44A and the distance between the two screw holes 44B may be the same.

Next, the first shutter 33A will be described. The first shutter 33A is formed in a sheet shape (that is, a planar shape). The first shutter 33A has a size which covers all the plurality of exhaust holes 42 of the first panel 32A. For example, a thickness of the first shutter 33A is constant over the entire region. The first shutter 33A has, for example, a quadrangular shape which follows an outer shape of the first panel 32A. However, the shape of the first shutter is not limited to the above-described example.

The first shutter 33A has flexibility and can be flexibly deformed when an external force is applied. In this specification, the expression "flexible" includes a case in which elasticity is provided (a case in which a reaction force acts when deformed) and a case in which elasticity is not provided (a case in which a reaction force does not act when deformed). The first shutter 33A is formed of, for example, a soft synthetic resin (for example, a polyester film). The material of the first shutter 33A preferably has excellent flame retardancy, heat resistance, durability, and strength. The thickness of the first shutter 33A is, for example, 1 mm or less, and more specifically, 0.5 mm or less. However, the material and thickness of the first shutter 33A are not limited to the above-described examples.

Figure 2:
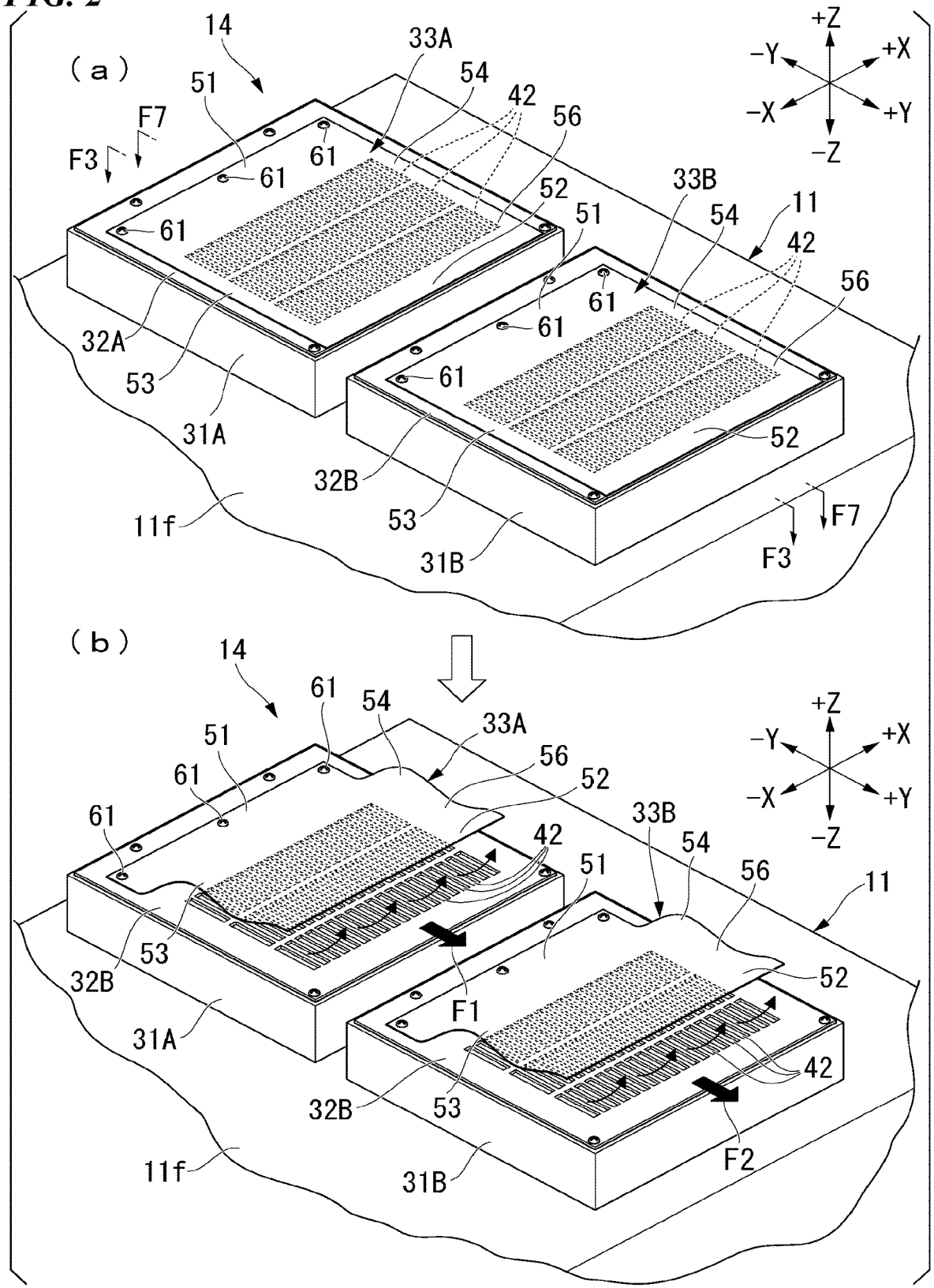
FIG. 2 is a perspective view showing the power conversion device according to the first embodiment.

FIG. 2 is a perspective view showing the power conversion device 1. A part (a) of FIG. 2 shows a state in which the fan 13A is stopped. A part (b) of FIG. 2 shows a state in which the fan 13A is driven. Also, arrows F1 and F2 in FIG. 2 will be described later.

The first shutter 33A is disposed outside the housing 11 and the first frame body 31A. In the embodiment, the first shutter 33A is disposed substantially horizontally above the housing 11 and the first frame body 31A. The first shutter 33A has a first end portion 51, a second end portion 52, a third end portion 53, and a fourth end portion 54.

The first end portion 51 is provided along one side of the quadrangular first shutter 33A. In the embodiment, the first end portion 51 is an end portion of the first shutter 33A in the −Y direction. The first end portion 51 is a fixed end portion fixed to the first frame body 31A. The first end portion 51 is fixed to the first panel 32A, for example, by a plurality of fixing members 61 such as screws. In other words, the first end portion 51 is fixed to the first frame body 31A via the first panel 32A. In this specification, the expression "fixed to the frame body" is not limited to a case in which it is directly fixed to the frame body but also includes a case in which it is fixed via another member (for example, the panel 32A). The plurality of fixing members 61 are arranged in an extending direction (for example, the X direction) of the first end portion 51 at intervals.

The second end portion 52 is located on the side of the first shutter 33A opposite to the first end portion 51. The third end portion 53 and the fourth end portion 54 are both end portions of the first shutter 33A in a direction (the X direction) different from a direction (the Y direction) in which the first end portion 51 is connected to the second end portion 52. The second to fourth end portions 52, 53, and 54 are not fixed to the housing 11, the first frame body 31A, and the first panel 32A. Therefore, a region of the first shutter 33A excluding the first end portion 51 forms a movable portion 56 which is movable in the Z direction with respect to the housing 11, the first frame body 31A, and the first panel 32A (refer to the part (b) of FIG. 2).

Figure 3:
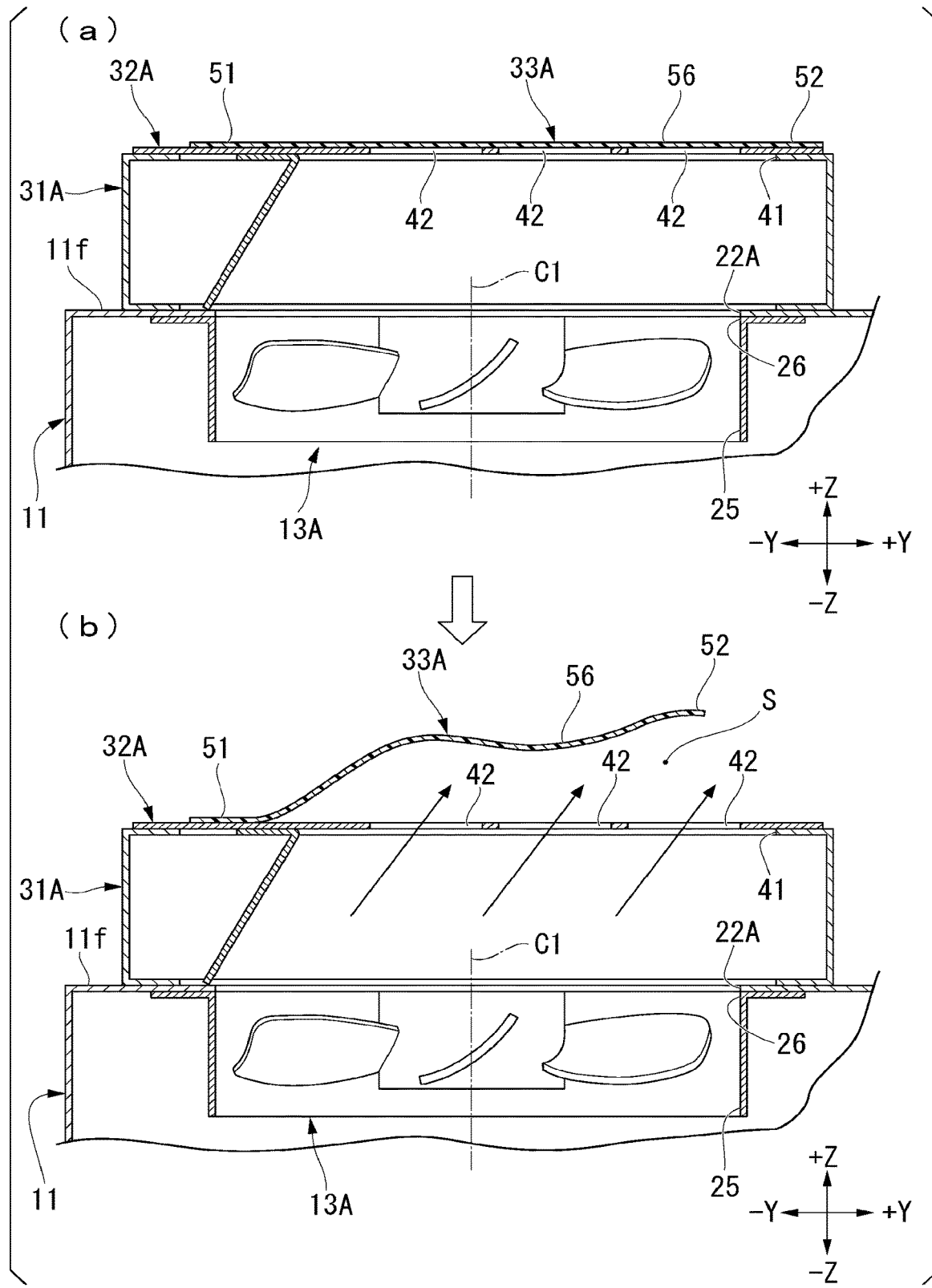
FIG. 3 is a cross-sectional view of the power conversion device shown in FIG. 2 taken along line F3-F3.

FIG. 3 is a cross-sectional view of the power conversion device 1 shown in FIG. 2 taken along line F3-F3. A part (a) of FIG. 3 shows a state in which the fan 13A is stopped. A part (b) of FIG. 3 shows a state in which the fan 13A is driven. When the first fan 13A is not driven, the movable portion 56 of the first shutter 33A is in contact with an upper surface of the first panel 32A and covers the plurality of exhaust holes 42 of the first panel, the exhaust port 41 of the first frame body 31A, the first opening portion 22A of the housing 11, and the first fan 13A from the upper side (refer to the part (a) of FIG. 3). In this specification, the expression "covering" is not limited to a case in which it completely covers an object but includes a case in which it covers only a part of the object. Further, the expression "the shutter covers the fan" also includes a case in which another member (the panel 32A in the embodiment) is present between the shutter and the fan.

In the embodiment, when the first fan 13A is not driven, the movable portion 56 of the first shutter 33A is located on the first panel 32A and is supported from the lower side by the first panel 32A. That is, when the first fan 13A is not driven, the first shutter 33A is supported in a substantially horizontal posture by the first panel 32A and covers the plurality of exhaust holes 42 and the like. In this specification, the expression "substantially horizontal posture" is not limited to a strict case in which the shutter completely extends substantially horizontally but also includes a case in which the shutter is bent in a process in which it returns from a state in which the shutter is deformed by the fan to an original state.

In the embodiment, when the first fan 13A is not driven, the second end portion 52, the third end portion 53, and the fourth end portion 54 of the first shutter 33A are located on the first panel 32A and supported from the lower side by the first panel 32A. Thus, the first shutter 33A is stably supported in a substantially horizontal posture.

On the other hand, when the first fan 13A is driven, the movable portion 56 of the first shutter 33A is deformed by wind from the first fan 13A, and a gap (a flow path) S through which the wind from the first fan 13A passes is formed between the first frame body 31A and the first shutter 33A (refer to the part (b) of FIG. 3). That is, the first shutter 33A forms the gap S between the upper surface of the first frame body 31A and the first shutter 33A by the movable portion 56 of the first shutter 33A being lifted up (raised) by the wind from the first fan 13A. In this specification, the expression "forming a gap between the first frame body and the first shutter" also includes a case in which the gap S is formed between the first panel 32A attached to the upper surface of the first frame body 31A and the first shutter 33A.

However, the wind from the first fan 13A is discharged from each of a gap between the second end portion 52 of the first shutter 33A and the first frame body 31A, a gap between the third end portion 53 of the first shutter 33A and the first frame body 31A, and a gap between the fourth end portion 54 of the first shutter 33A and the first frame body 31A (refer to FIG. 2). Here, when the first fan 13A is driven, the second end portion 52 of the first shutter 33A is lifted up highest among the second end portion 52, the third end portion 53, and the fourth end portion 54. Therefore, an amount of wind exhausted from the gap between the second end portion 52 of the first shutter 33A and the first frame body 31A is larger than each of an amount of wind exhausted from the gap between the third end portion 53 of the first shutter 33A and the first frame body 31A and an amount of wind exhausted from the gap between the fourth end portion 54 of the first shutter 33A and the first frame body 31A. Therefore, in this specification, a flow direction of the wind exhausted from the gap between the second end portion 52 of the first shutter 33A and the first frame body 31A is referred to as "main flow direction." In the embodiment, since the first end portion 51 is located on the side of the first shutter 33A in the −Y direction, the +Y direction corresponds to the "main flow direction".

In the embodiment, the first shutter 33A and the second shutter 33B are disposed side by side in the Y direction. Additionally, in the embodiment, arrangement positions of the first end portion 51 of the first shutter 33A and the first end portion 51 of the second shutter 33R are set so that a main flow direction F1 of the wind exhausted from the gap S formed by the first shutter 33A is a direction from the first shutter 33A toward a side above the second shutter 33B and a main flow direction F2 of the wind exhausted from the gap S formed by the second shutter 33B is a direction from the second shutter 33B toward the side opposite to the first shutter 33A (refer to FIG. 2). Specifically, the first end portion 51 of the first shutter 33A is disposed on the side of the first shutter 33A in the −Y direction. Similarly, the first end portion 51 of the second shutter 33B is disposed on the side of the second shutter 33B in the −Y direction.

When the driving of the first fan 13A is stopped, the first shutter 33A is lifted down by a weight of the first shutter 33A and returns to the top of the first panel 32A. Thus, the plurality of exhaust holes 42 of the first panel, the exhaust port 41 of the first frame body 31A, the first opening portion 22A of the housing 11, and the first fan 13A are covered again from the upper side, and the plurality of exhaust holes 42 of the first panel 32A are closed by the first shutter 33A. Accordingly, when the power conversion device 1 is stopped (when the first fan 13A is stopped), it is difficult for external dust or the like to enter the inside of the power conversion device 1.

Figure 4:
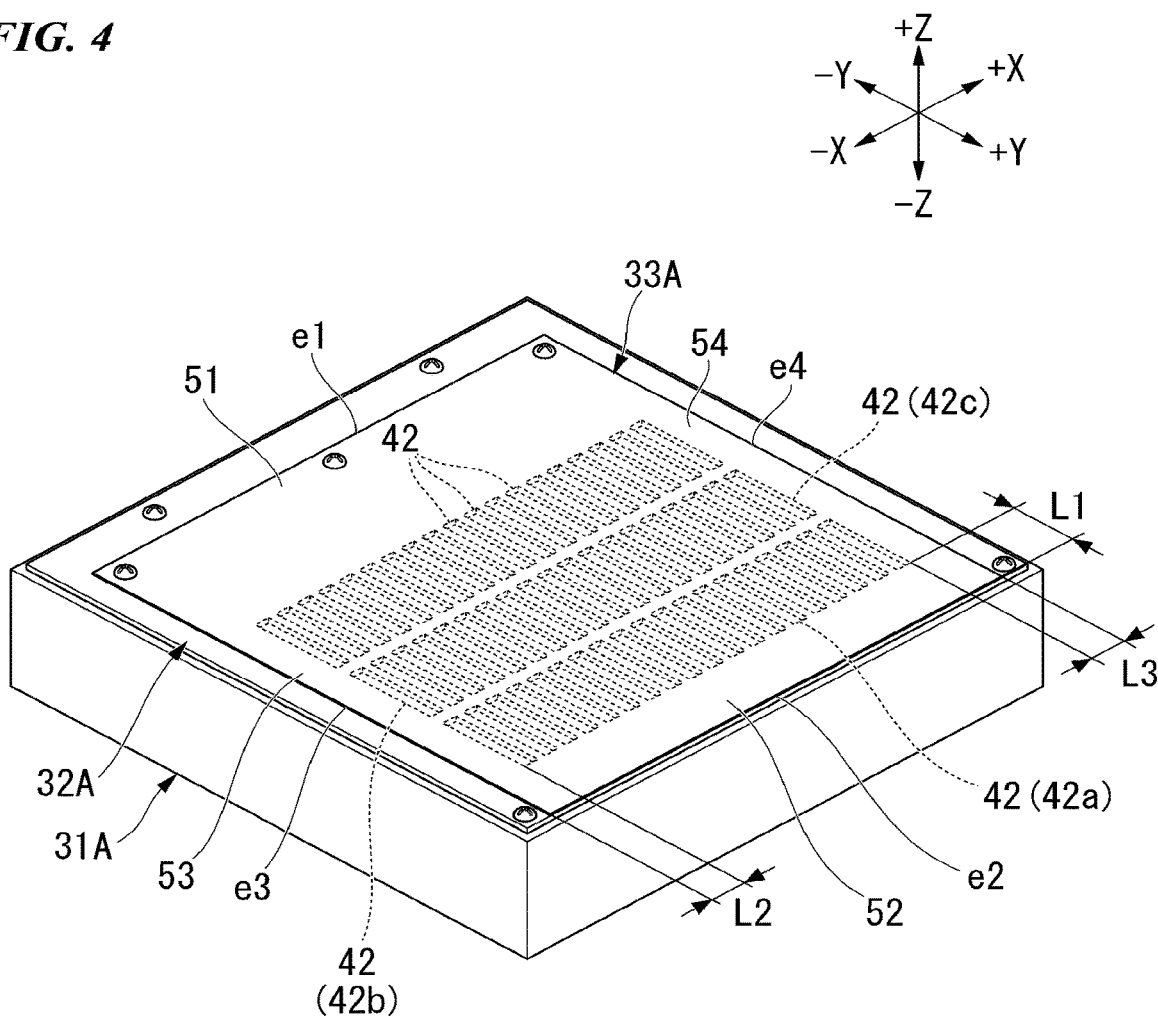
FIG. 4 is a perspective view showing a part of the power conversion device according to the first embodiment.

Next, a size of the first shutter 33A will be described. FIG. 4 is a perspective view showing a part of the power conversion device 1. Here, the plurality of exhaust holes 42 of the first panel 32A include a first hole 42a, a second hole 42b, and a third hole 42c. The first hole 42a is a hole closest to the second end portion 52 of the first shutter 33A among the plurality of exhaust holes 42 in a state in which the first fan 13A is not driven. The second hole 42b is a hole closest to the third end portion 53 of the first shutter 33A among the plurality of exhaust holes 42 in the state in which the first fan 13A is not driven. The third hole 42c is a hole closest to the fourth end portion 54 of the first shutter 33A among the plurality of exhaust holes 42 in the state in which the first fan 13A is not driven.

Further, the first shutter 33A includes a first edge (a first side) e1 which defines the first end portion 51, a second edge (a second side) e2 which defines the second end portion 52, a third edge (a third side) e3 which defines the third end portion 53, and a fourth edge (a fourth side) e4 which defines the fourth end portion 54. Additionally, in a state in which the first fan 13A is not driven (a state in which the first shutter 33A extends in a planar shape), when a shortest distance between the first hole 42a and the second edge e2 is a first distance L1, a shortest distance between the second hole 42b and the third edge e3 is a second distance L2, and a shortest distance between the third hole 42c and the fourth edge e4 is a third distance L3, the first distance L1 is longer than each of the second distance L2 and the third distance L3.

Figure 5:
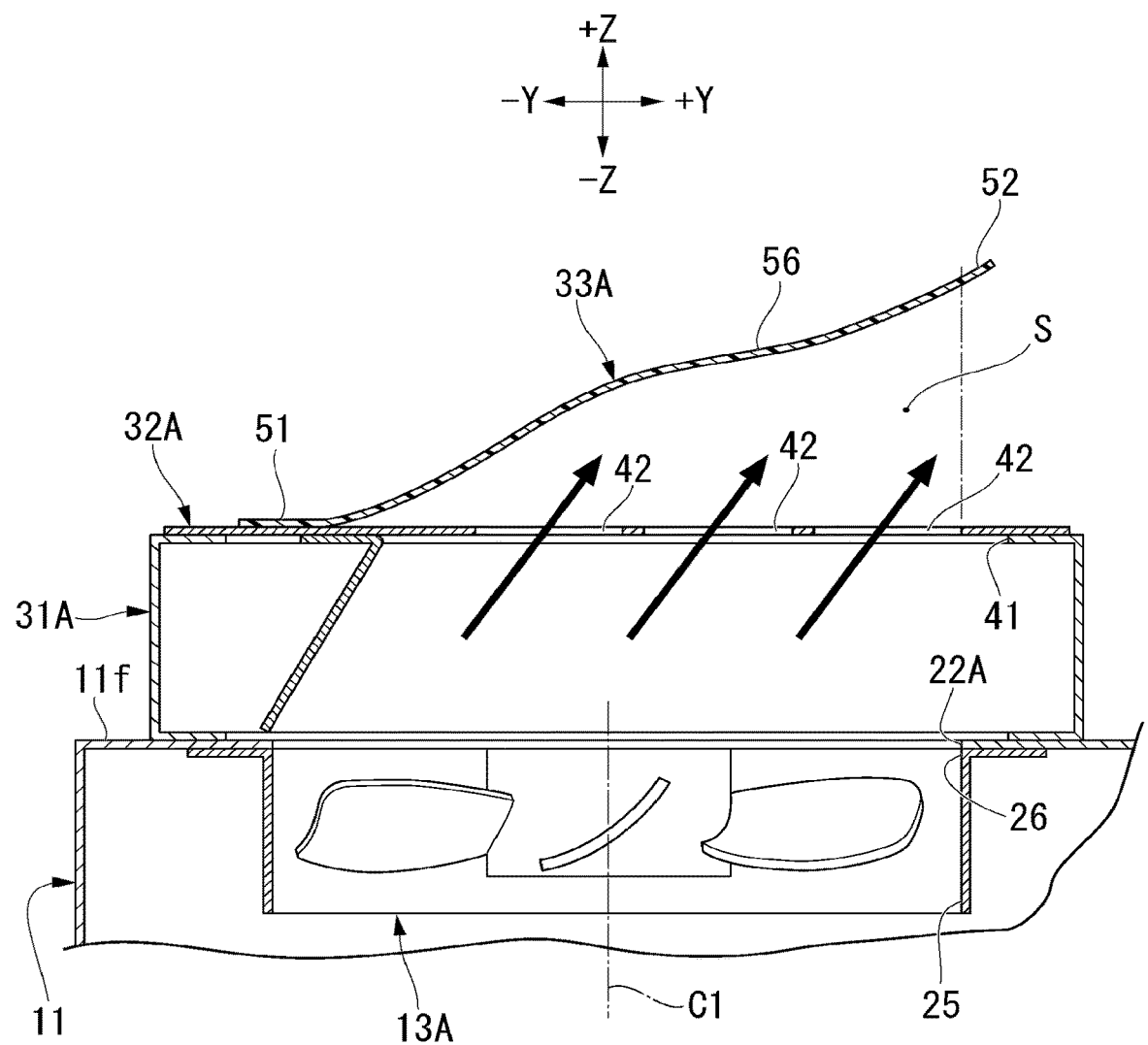
FIG. 5 is a cross-sectional view showing the power conversion device according to the first embodiment.

Further, from another viewpoint, the first shutter 33A may have a size described below. FIG. 5 is a cross-sectional view showing the power conversion device 1 when the first fan 13A is driven at a maximum rated output. The "maximum rated output" is a maximum output among multiple stages in the case of a fan of which an output as a rated output can be switched between the multiple stages, and is an output in an ON state in the case of a fan of which an output can be switched between ON and OFF only. In a state in which the first fan 13A is driven at the maximum rated output and the first shutter 33A is deformed by the wind from the first fan 13A, the first shutter 33A has such a size that the second end portion 52 of the first shutter 33A remains on a side opposite to the first end portion 51 with respect to the first hole 42a. That is, the second end portion 52 of the first shutter 33A is located on the side in the +Y direction from an end portion of the first hole 42a in the +Y direction in the state in which the first fan 13A is driven at the maximum rated output.

Next, the arrangement positions of the plurality of exhaust holes 42 in the first panel 32A will be described. In the embodiment, the plurality of exhaust holes 42 are disposed at positions biased with respect to the center of the first panel 32A. That is, the plurality of exhaust holes 42 is disposed closer to the second end portion 52 than to the first end portion 51 of the first shutter 33A.

Figure 6:
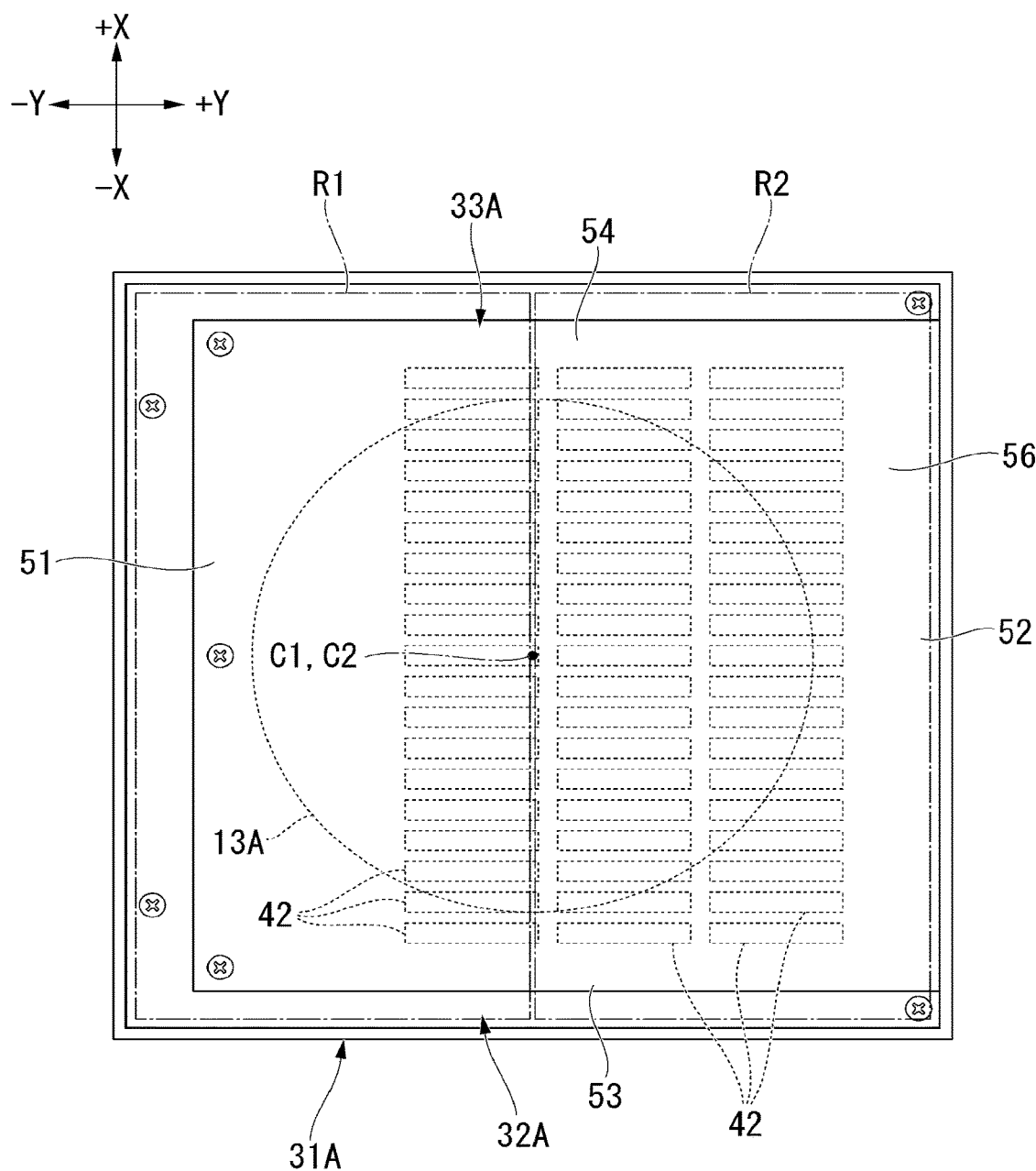
FIG. 6 is a plan view showing a part of the power conversion device according to the first embodiment.

FIG. 6 is an enlarged plan view showing a part of the power conversion device 1. The first panel 32A includes a first region R1 and a second region R2. The first region R1 is a region located on the side in the −Y direction with respect to a center C2 of the first panel 32A (which coincides with the rotation center axis C1 of the first fan 13A). The second region R2 is a region located on the side in the +Y direction with respect to the center C2 of the first panel 32A. Additionally, the total opening area of the plurality of exhaust holes 42 in the second region R2 is larger than the total opening area of the plurality of exhaust holes 42 in the first region R1.

Figure 7:
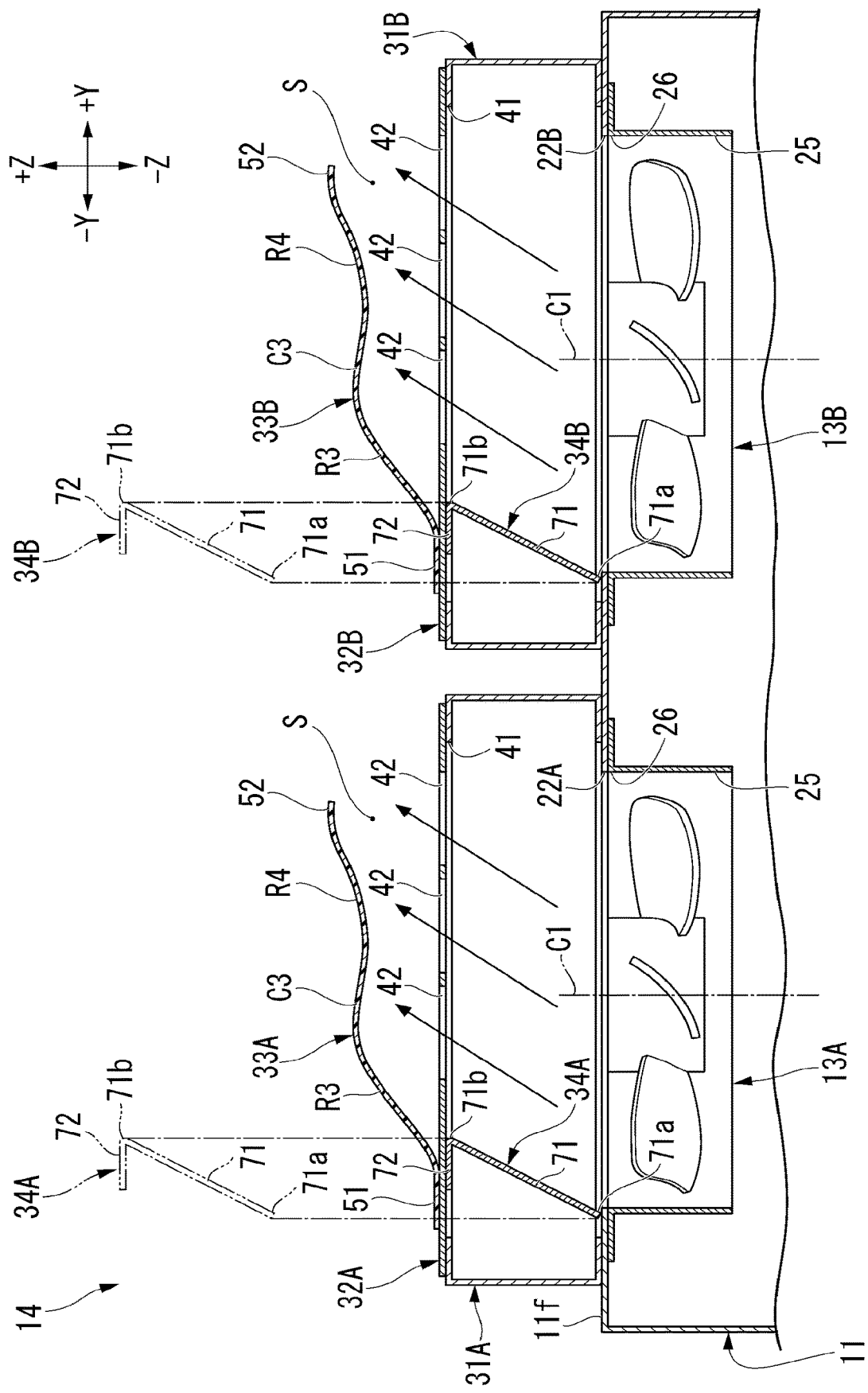
FIG. 7 is a cross-sectional view of the power conversion device shown in FIG. 2 taken along line F7-F7.

Next, the first flow guide plate 34A will be described. FIG. 7 is a cross-sectional view of the power conversion device shown in FIG. 2 taken along line F7-F7. Here, the first shutter 33A includes a first region R3 and a second region R4. The first region R3 is a region located between a center C3 of the first shutter 33A and the first end portion 51. The second region R4 is a region located between the center C3 of the first shutter 33A and the second end portion 52.

The first flow guide plate 34A is accommodated in the first frame body 31A. The first flow guide plate 34A includes an inclined portion 71 inclined with respect to the rotation center axis C1 of the first fan 13A and changes, toward the second region R4 of the first shutter 33A, the flow direction of at least some of the wind from the first fan 13A. For example, the first flow guide plate 34A is provided over the entire width inside the first frame body 31A in the X direction.

In the embodiment, the first flow guide plate 34A includes the inclined portion 71 and a fixed portion 72. The inclined portion 71 is inclined obliquely with respect to the rotation center axis C1 of the first fan 13A to be located on the side in the +Y direction as it goes upward. In the embodiment, the inclined portion 71 has a first end portion 71a (a lower end portion) located on the side in the −Z direction and a second end portion 71b (an upper end portion) located on the side in the +Z direction. For example, the first end portion 71a is located on the side in the −Y direction from an end portion of the first fan 13A in the −Y direction. The first end portion 71a does not overlap the first fan 13A in the Z direction. On the other hand, the second end portion 71b is located on the side in the +Y direction from the first end portion 71a. The second end portion 71b overlaps the first fan 13A in the Z direction.

For example, the fixed portion 72 of the first flow guide plate 34A is bent from the second end portion 71b of the inclined portion 71 in the −Y direction. For example, the fixed portion 72 is fixed to a lower surface of the first panel 32A. However, the position and shape of the fixed portion 72 are not limited to the above-described example.

According to the above-described constitution, the shutter of the power conversion device 1 can be easily operated as designed over a long period of time. Here, a case in which a metal shutter plate for opening and closing the exhaust port of the power conversion device 1 is provided is considered as a comparative example. A power conversion device of this comparative example includes a metal shutter plate which is rotated by a wind pressure of a fan, and a support shaft (a shutter shaft) which rotatably supports the shutter plate. In such a constitution, the shutter shaft which rotatably supports the shutter may deteriorate over time, and the shutter may not be operated as designed in the long-term use of the power conversion device.

In the constitution of the comparative example, it is necessary to rotate the metal shutter having a certain weight by the wind pressure of the fan. Thus, the shutter shaft is not provided at an end portion of the shutter but is provided in the vicinity of a center of the shutter, and a part of the shutter is constituted to serve as a counterweight. In such a constitution, although the metal shutter having a certain weight can be rotated by the wind pressure of the fan, a height space is required for the counterweight to sink when the shutter rotates, and fine adjustments regarding a weight balance of the shutter are required.

On the other hand, in the embodiment, the power conversion device 1 has the flexible first shutter 33A. The first shutter 33A is formed in a sheet shape. The first shutter 33A is deformed by the wind from the first fan 13A when the first fan 13A is driven and forms the gap S through which the wind passes between the first frame body 31A and the first shutter 33A. According to such a constitution, since the shutter shaft which rotatably supports the shutter is not necessary, there is no problem associated with the deterioration of the shutter shaft over time. As a result, the shutter can be easily operated as designed over a long period of time. Further, according to the constitution of the embodiment, since it is not necessary to secure the height space for the counterweight to sink, the entire device can be downsized. Furthermore, since it is not necessary to perform the fine adjustments regarding the weight balance of the shutter, an installation work and maintenance become easy.

In the embodiment, the first shutter 33A is disposed substantially horizontally above the housing 11, and as the movable portion 56 is lifted upward by the wind, the gap S is formed. According to such a constitution, the first shutter 33A can easily return to an original position thereof by its own weight when the first fan 13A is stopped. Thus, a dustproof property of the power conversion device 1 can further be improved.

In the embodiment, the power conversion device 1 further includes the first panel 32A which is disposed between the first fan 13A and the first shutter 33A and which has the plurality of exhaust holes 42. According to such a constitution, a falling object from the upper side can be received by the first panel 32A, and the inside of the power conversion device 1 can be protected even when the shutter is soft.

In the embodiment, the first panel 32A is disposed between the first frame body 31A and the first shutter 33A and supports the first shutter 33A substantially horizontally when the first fan 13A is not driven. According to such a constitution, the first shutter 33A can easily extend in a substantially horizontal posture, and thus, the plurality of exhaust holes 42 are likely to be covered with the first shutter 33A as compared with a case in which the first shutter 33A is likely to be bent. Accordingly, the dustproof property of the power conversion device 1 can further be improved.

In the embodiment, the plurality of exhaust holes 42 is disposed closer to the second end portion 52 than to the first end portion 51 of the first shutter 33A. According to such a constitution, more wind can be applied to the second end portion 52 of the first shutter 33A than the first end portion 51 of the first shutter 33A. As a result, a lifting posture of the first shutter 33A is stabilized, and a large gap S is easily secured. Thus, the air in the housing 11 can be more smoothly discharged to the outside. This leads to an improvement in cooling performance of the power conversion device 1. In addition, in the case in which more wind can be applied to the second end portion 52 than the first end portion 51 of the first shutter 33A, it is difficult for a central portion of the first shutter 33A to be bent when the first fan 13A stops and the first shutter 33A returns to the original position. As a result, the dustproof property of the power conversion device 1 can be further enhanced.

In the embodiment, for example, in the state in which the first fan 13A is driven at the maximum rated output and the first shutter 33A is deformed by the wind, the first shutter 33A has such a size that the second end portion 52 remains on the side opposite to the first end portion 51 with respect to the first hole 42a. According to such a constitution, when the first fan 13A stops and the first shutter 33A returns to the original position, all the exhaust holes 42 are likely to be blocked more reliably. Thus, the dustproof property of the power conversion device 1 can further be improved.

In the embodiment, the first flow guide plate 34A has the inclined portion 71 which is inclined with respect to the rotation center axis C1 of the first fan 13A, and the flow direction of at least some of the wind from the first fan 13A is changed toward the second region R4 of the first shutter 33A. According to such a constitution, more wind can be applied to the second region R4 of the first shutter 33A than the first region R3 of the first shutter 33A. As a result, the lifting posture of the first shutter 33A is stabilized, and a large gap S is easily secured. Thus, the air in the housing 11 can be more smoothly discharged to the outside. This leads to an improvement in the cooling performance of the power conversion device 1. Further, in the case in which more wind can be applied to the second region R4 of the first shutter 33A than the first region R3 of the first shutter 33A, it is difficult for the central portion of the first shutter 33A to be bent when the first fan 13A stops and the first shutter 33A returns to the original position. As a result, the dustproof property of the power conversion device 1 can be further enhanced. Furthermore, when the first flow guide plate 34A is provided, a flow of wind is easily stabilized inside the first frame body 31A. As a result, it is possible to curb vibration (for example, shaking in the Z direction) of the first shutter 33A, and it is possible to curb or substantially eliminate noise associated with the vibration.

In the embodiment, the main flow direction F1 of the wind exhausted from the gap S formed by the first shutter 33A is a direction from the first shutter 33A toward the side above the second shutter 33B, and the main flow direction F2 of the wind exhausted from the gap S formed by the second shutter 33B is the direction from the second shutter 33B toward the side opposite to the first shutter 33A. According to such a constitution, the wind exhausted from the gap S formed by the first shutter 33A and the wind exhausted from the gap S formed by the second shutter 33B are less likely to interfere with each other, as compared with a case in which the two main flow directions of the wind face each other or are parallel to each other (for example, both are directed in the +X direction). Therefore, the vibration of the first and second shutters 33A and 33B can be curbed, and the noise associated with the vibration can be curbed or substantially eliminated.

Second Embodiment

Next, a second embodiment will be described. The second embodiment is different from the first embodiment in the main flow direction of the wind. The constitutions other than those described below are the same as those in the first embodiment.

Figure 8:
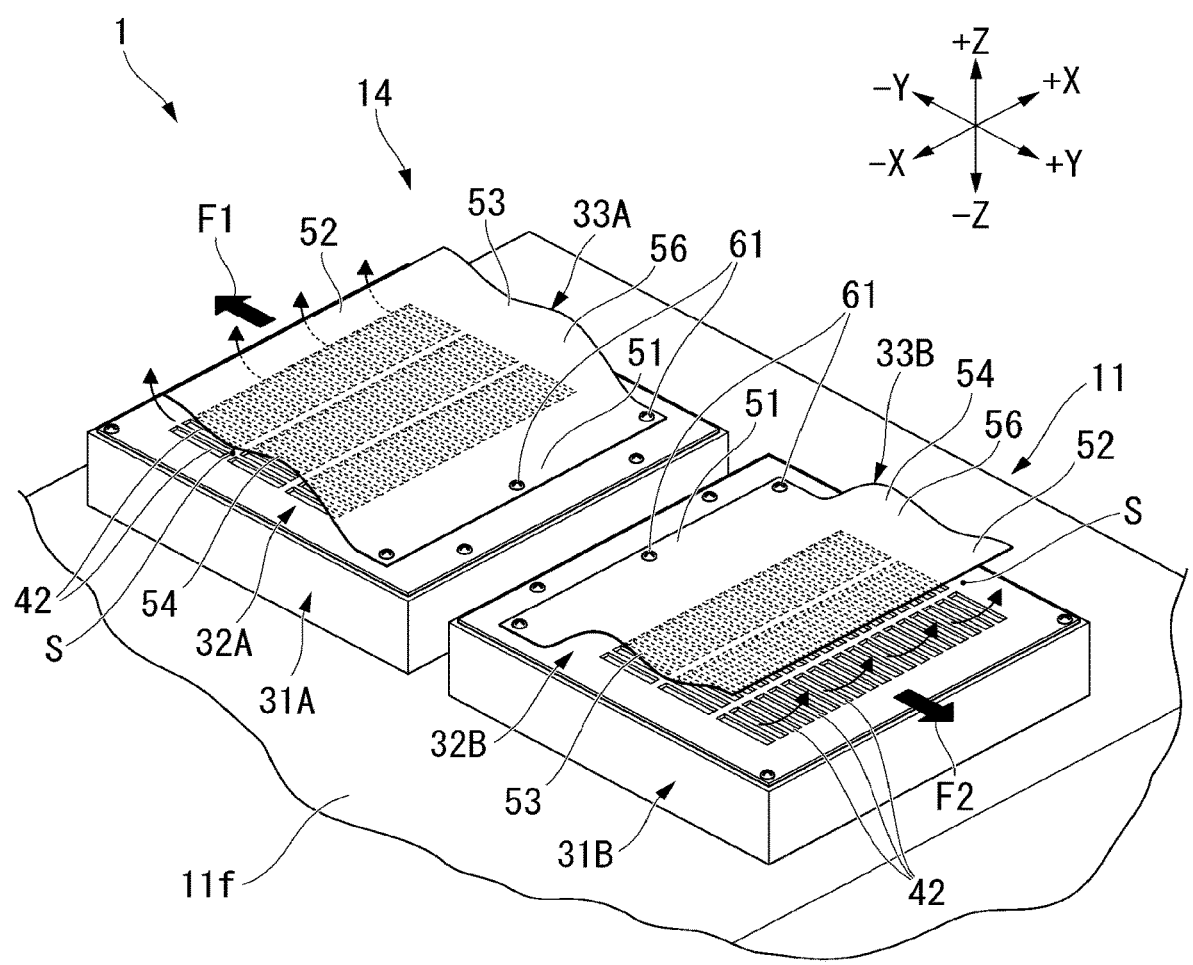
FIG. 8 is a perspective view showing a power conversion device according to a second embodiment.

FIG. 8 is a perspective view showing a power conversion device 1 according to a second embodiment. As shown in FIG. 8, in this embodiment, an arrangement positions of the first end portion 51 of the first shutter 33A and the first end portion 51 of the second shutter 33B are set so that the main flow direction F1 of the wind exhausted from the gap S formed by the first shutter 33A and the main flow direction F2 of the wind exhausted from the gap S formed by the second shutter 33B are different directions which do not face each other. Specifically, the first end portion 51 of the first shutter 33A is disposed on the side of the first shutter 33A in the +Y direction. Similarly, the first end portion 51 of the second shutter 33B is disposed on the side of the second shutter 33B in the −Y direction. In the embodiment, the two main flow directions F1 and F2 of the wind are opposite to each other.

According to such a constitution, the wind exhausted from the gap S formed by the first shutter 33A and the wind exhausted from the gap S formed by the second shutter 33B are less likely to interfere with each other, as compared with the case in which the two main flow directions of the wind face each other or are parallel to each other (for example, both are directed in the +X direction). Therefore, the vibration of the first and second shutters 33A and 33B can be curbed, and the noise associated with the vibration can be curbed or substantially eliminated.

Also, the main flow direction F1 of the wind exhausted through the gap S formed by the first shutter 33A and the main flow direction F2 of the wind exhausted through the gap S formed by the second shutter 33B may be different directions which do not face each other and may be different directions from the above-described example.

Third Embodiment

Next, a third embodiment will be described. The third embodiment is different from the first embodiment in that the first frame body 31A and the second frame body 31B are integrally provided as one frame body 31. The constitutions other than those described below are the same as those in the first embodiment.

Figure 9:
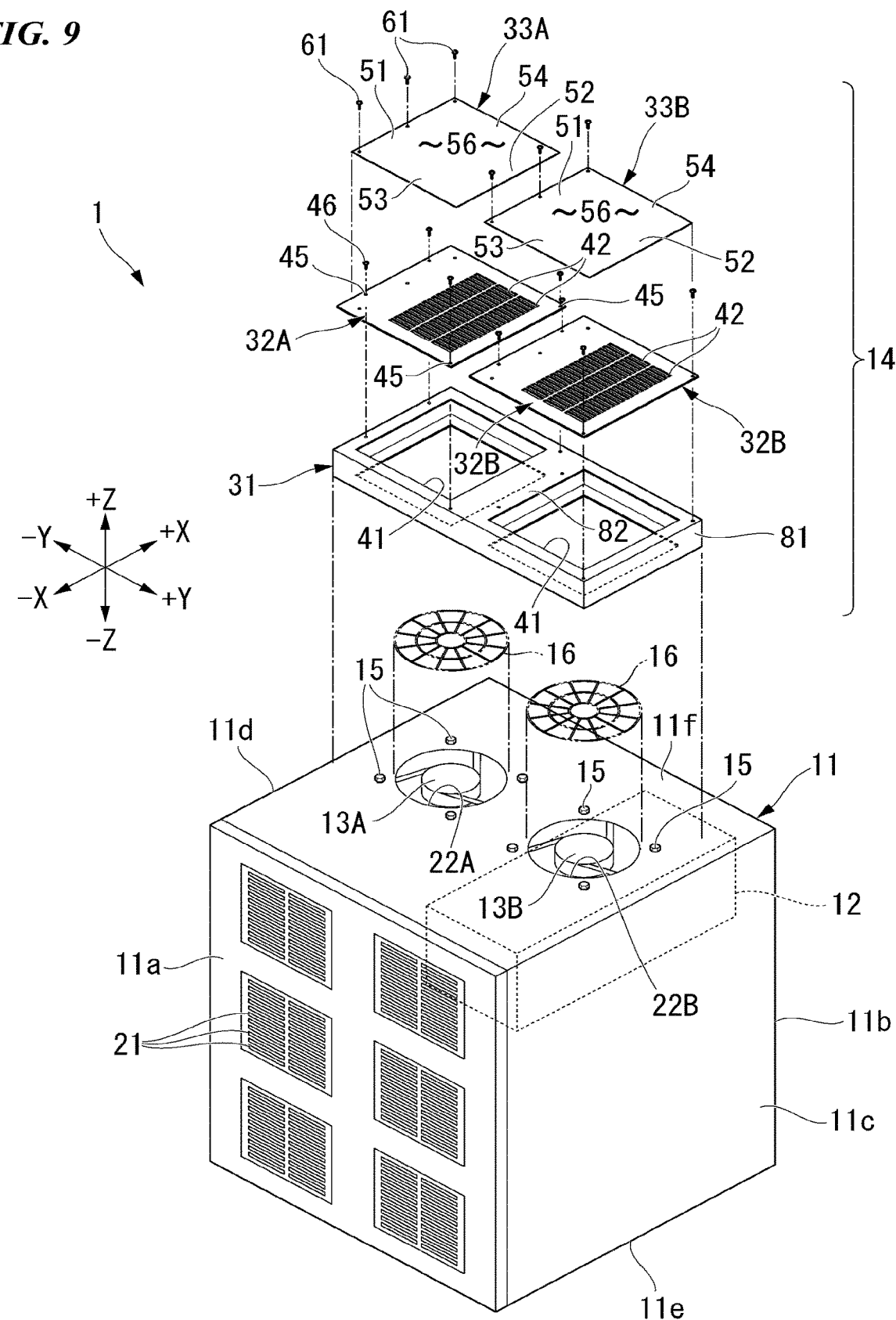
FIG. 9 is a partially exploded perspective view showing a power conversion device according to a third embodiment.

FIG. 9 is a partially exploded perspective view showing a power conversion device 1 according to a third embodiment. The power conversion device 1 according to the third embodiment includes a frame body 31 instead of the first frame body 31A and the second frame body 31B. The frame body 31 includes a frame min body 81 and a partition member 82. The frame body 31 is formed in a quadrangular frame shape which surrounds the first and second opening portions 22A and 22B in a plan view. The partition member 82 is provided at a substantially central portion of the frame body 31 in the Y direction. The partition member 82 extends in the X direction and partitions (for example, airtightly partitions) an inner region of the frame body 31 into a region corresponding to the first opening portion 22A and a region corresponding to the second opening portion 22B.

According to such a constitution, for example, even when the first fan 13A is operated in a state in which the second fan 13B is stopped, the wind from the first fan 13A is not directed to the exhaust hole 42 of the second panel 32B but tends to be directed to the exhaust hole 42 of the first panel 32A. Thus, the flow of wind in the frame body 31 is easy to stabilize, the vibration of the first shutter 33A can be curbed, and the noise associated with the vibration can be curbed or substantially eliminated.

Fourth Embodiment

Next, a fourth embodiment will be described. The fourth embodiment is different from the first embodiment in that metal mesh members 91A and 91B for EMI countermeasures are provided in place of the panels 32A and 32B. The constitutions other than those described below are the same as those in the first embodiment.

Figure 10:
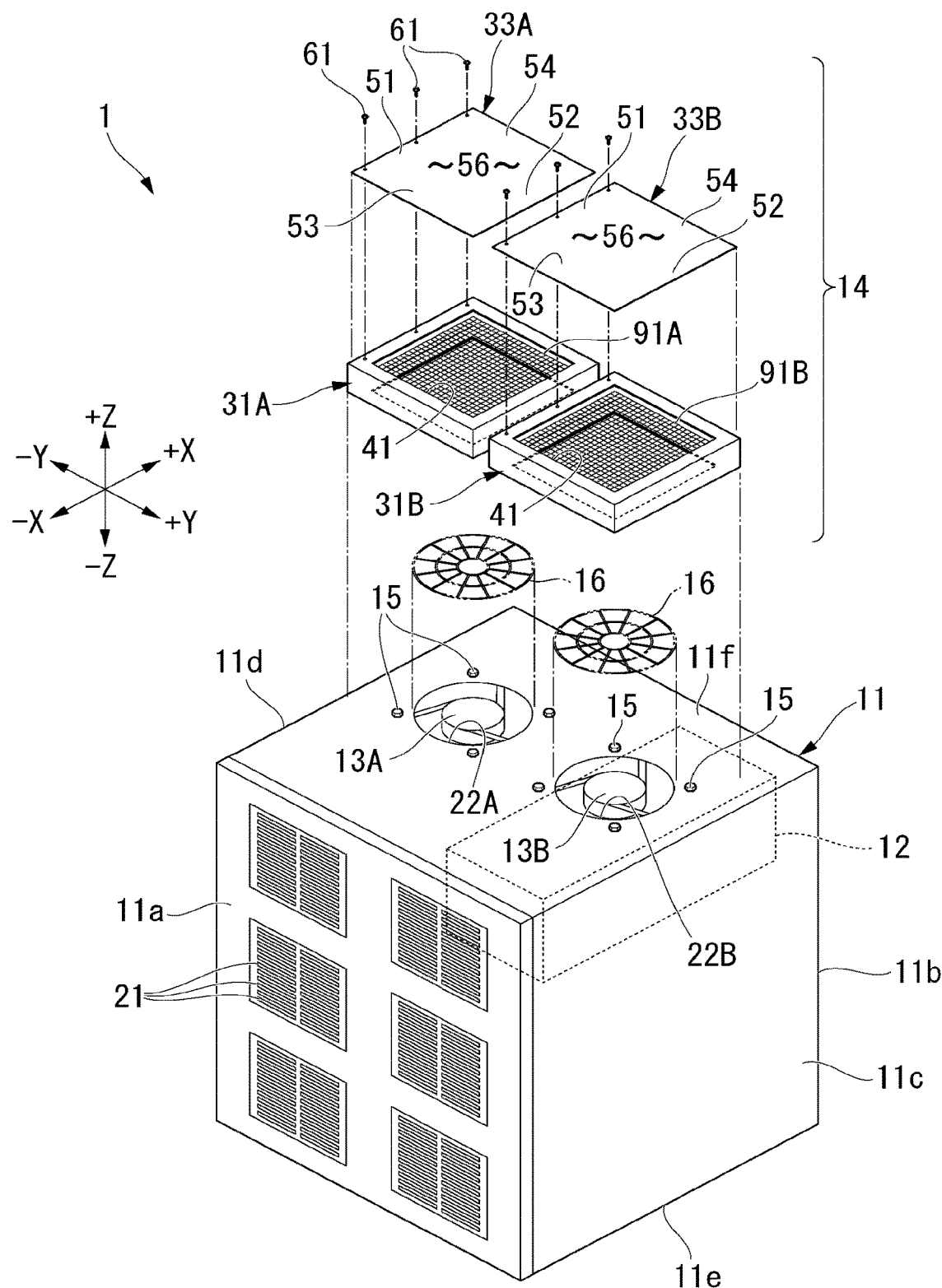
FIG. 10 is a partially exploded perspective view showing a power conversion device according to a fourth embodiment.

FIG. 10 is a partially exploded perspective view showing the power conversion device 1 according to the fourth embodiment. The power conversion device 1 according to the fourth embodiment includes the first and second metal mesh members 91A and 91B for EMI countermeasures. The first metal mesh member 91A is accommodated in the first frame body 31A and is located between the first fan 13A and the first shutter 33A. The second metal mesh member 91B is accommodated in the second frame body 31B and is located between the second fan 13B and the second shutter 33B. Each of the first and second metal mesh members 91A and 91B is an example of the "mesh member".

According to such a constitution, even when the shutters 33A and 33B formed of a synthetic resin are provided, an influence of electromagnetic interference is curbed by the metal mesh members 91A and 91B provided using the frame bodies 31A and 31B. The "mesh member" is not limited to a metallic material and may be formed of a synthetic resin or other materials. For example, the mesh member may have one or more of a function as a support member which supports the shutters 33A and 33B in a substantially horizontal posture when the fans 13A and 13B are not driven, a function as a protective member which protects the inside of the power conversion device 1 from a falling object (for example, a tool or the like when a work is performed on the upper side) from the upper side, and a function as a safety member which prevents a user or a worker of the power conversion device 1 from reaching for the fans 13A and 13B by mistake, instead of (or in addition to) the function which curbs the influence of electromagnetic interference.

Fifth Embodiment

Next, a fifth embodiment will be described. The fifth embodiment is different from the first embodiment in that the fans 13A and 13B are accommodated in frame bodies 31A and 31B instead of the housing 11. The constitutions other than those described below are the same as those in the first embodiment.

Figure 11:
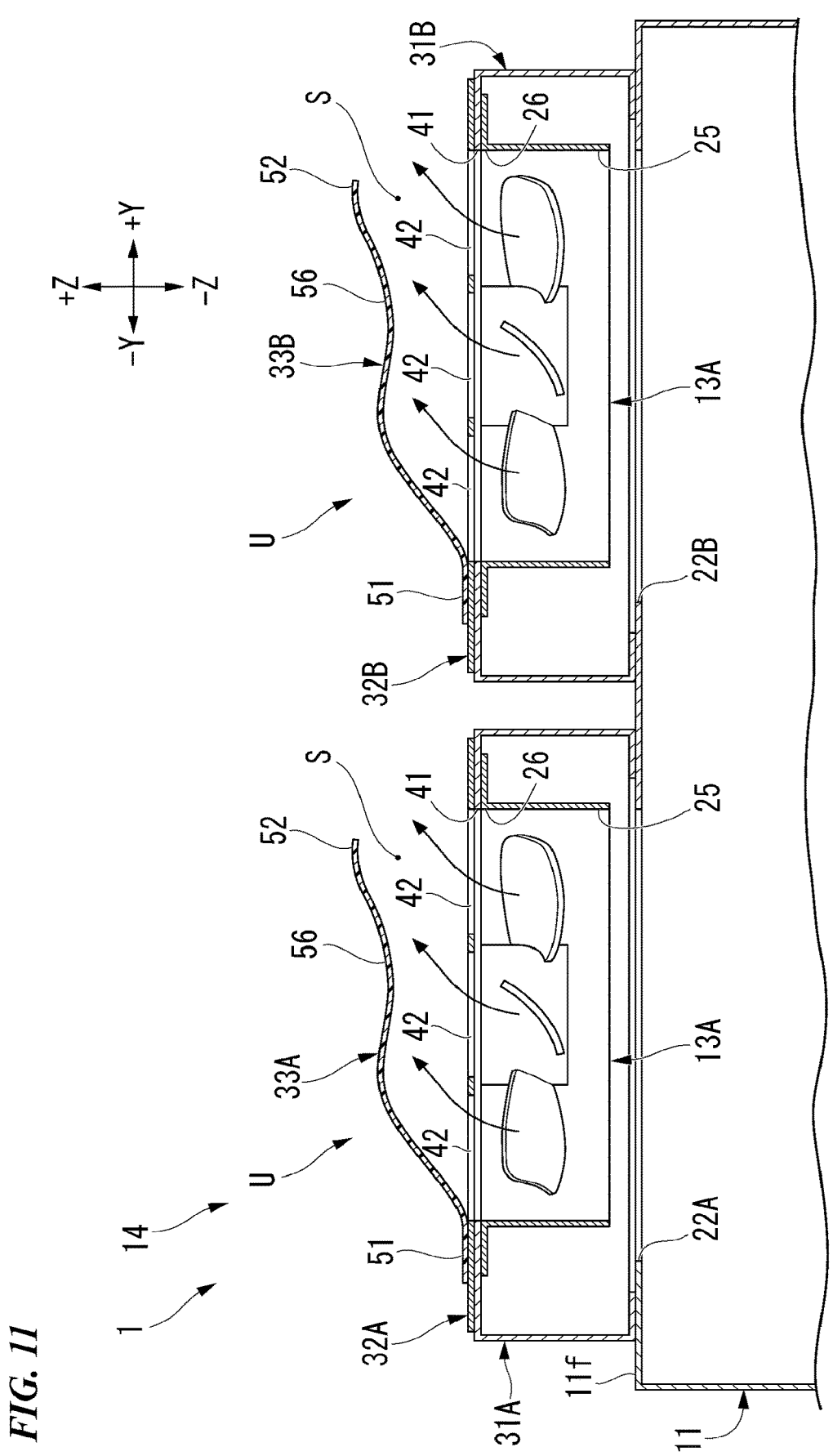
FIG. 11 is a cross-sectional view showing a power conversion device according to a fifth embodiment.

FIG. 11 is a cross-sectional view showing the power conversion device 1 according to the fifth embodiment. In the power conversion device 1 according to the fifth embodiment, the first fan 13A is accommodated in the first frame body 31A instead of the housing 11. Thus, the first fan 13A, the first frame body 31A, the first panel 32A, and the first shutter 33A form one unit U. The unit U can be installed in or exchanged with respect to the housing 11 in units of the unit U. In the embodiment, the same can be applied to the second fan 13B.

According to such a constitution, these members can be installed in or exchanged with respect to the housing 11 in units of the unit U including the first fan 13A, the first frame body 31A, the first shutter 33A, and the like. Thus, workability of the installation and maintenance of the power conversion device 1 can be improved.

Sixth Embodiment

Next, a sixth embodiment will be described. The sixth embodiment is different from the first embodiment in that the frame bodies 31A and 31B are not provided and the panels 32A and 32B and the shutters 33A and 33B are directly attached to the housing 11. The constitutions other than those described below are the same as those in the first embodiment.

Figure 12:
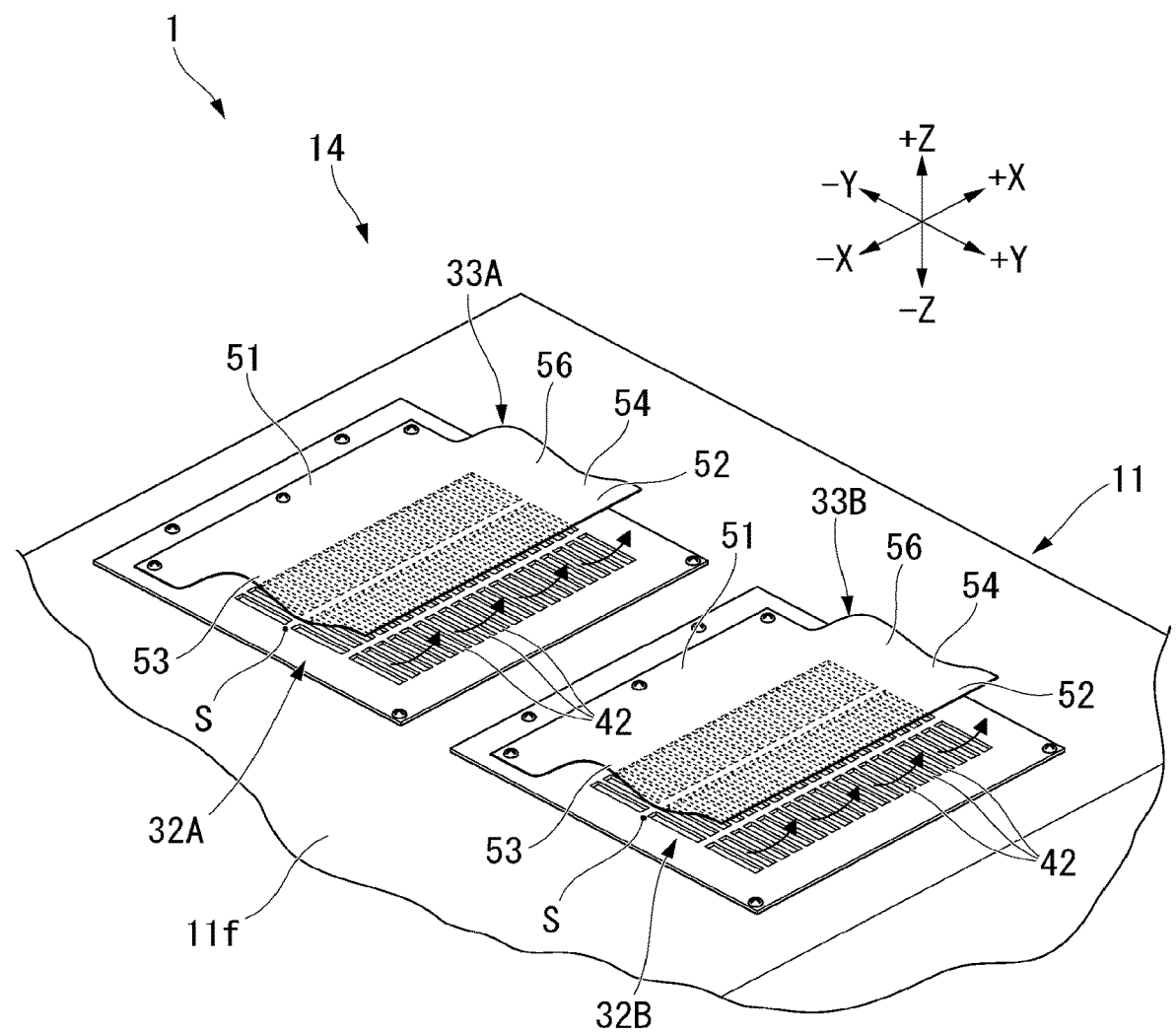
FIG. 12 is a perspective view showing a power conversion device according to a sixth embodiment.
Figure 13:
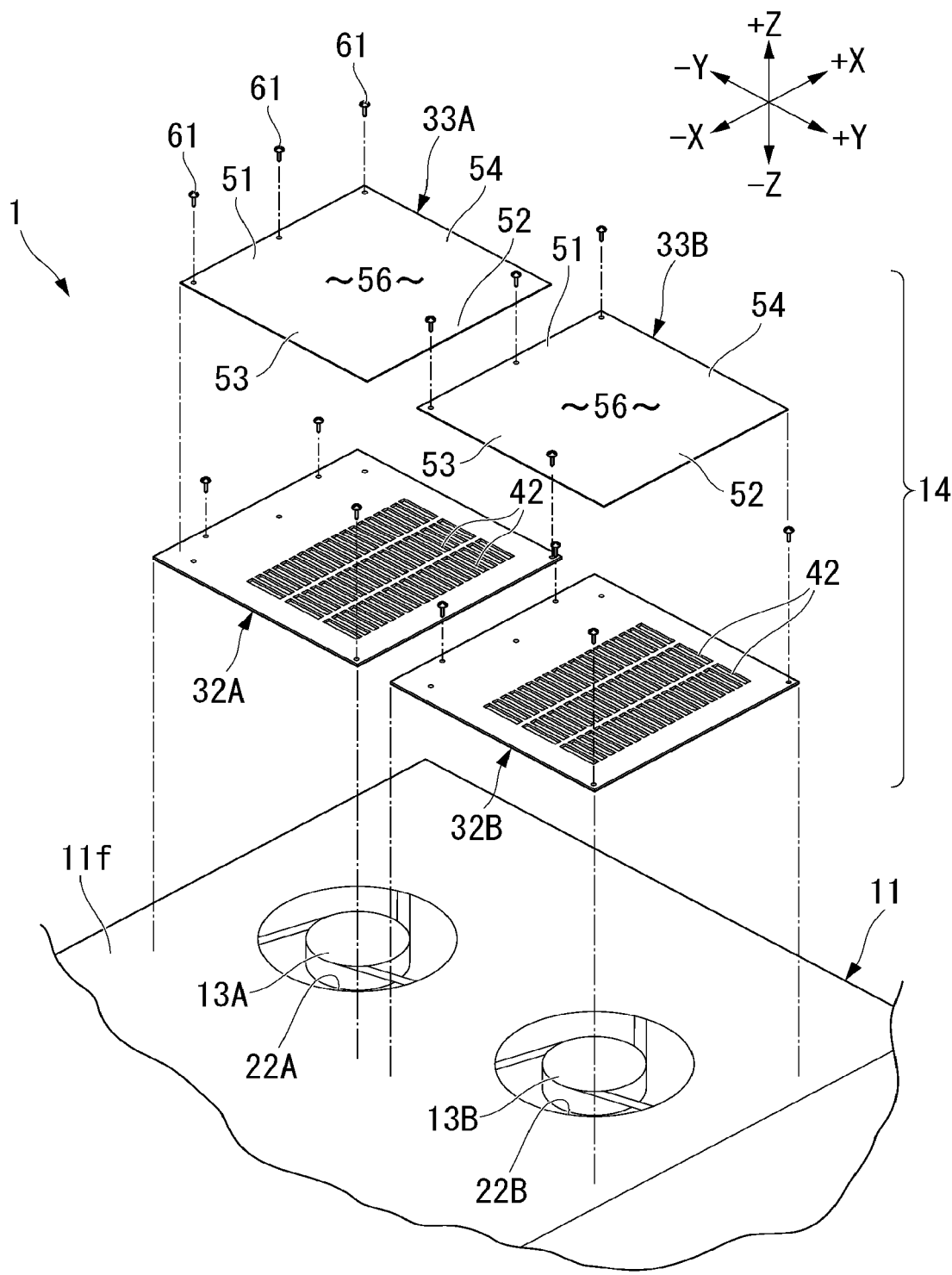
FIG. 13 is a partially exploded perspective view showing the power conversion device according to the sixth embodiment.

FIG. 12 is a perspective view showing the power conversion device 1 according to the sixth embodiment. FIG. 13 is a partially exploded perspective view showing the power conversion device 1 according to the sixth embodiment. In the embodiment, the first and second panels 32A and 32B are placed on the upper surface of the upper wall 11f of the housing 11 and directly fixed to the upper wall 11f. The first end portions 51 of the first and second shutters 33A and 33B are respectively fixed to the first and second panels 32A and 32B. In other words, the first end portion 51 of the first shutter 33A is fixed to the housing 11 via the first panel 32A. In this specification, the expression "fixed to the housing" is not limited to a case in which it is directly fixed to the housing, but includes a case in which it is fixed via another member (for example, the panel 32A). The same can be applied to the second shutter 33B.

Even with such a constitution, it is possible to provide a shutter structure in which the shutter shaft is not present, and the shutter can be easily operated as designed over a long period of time.

Figure 14:
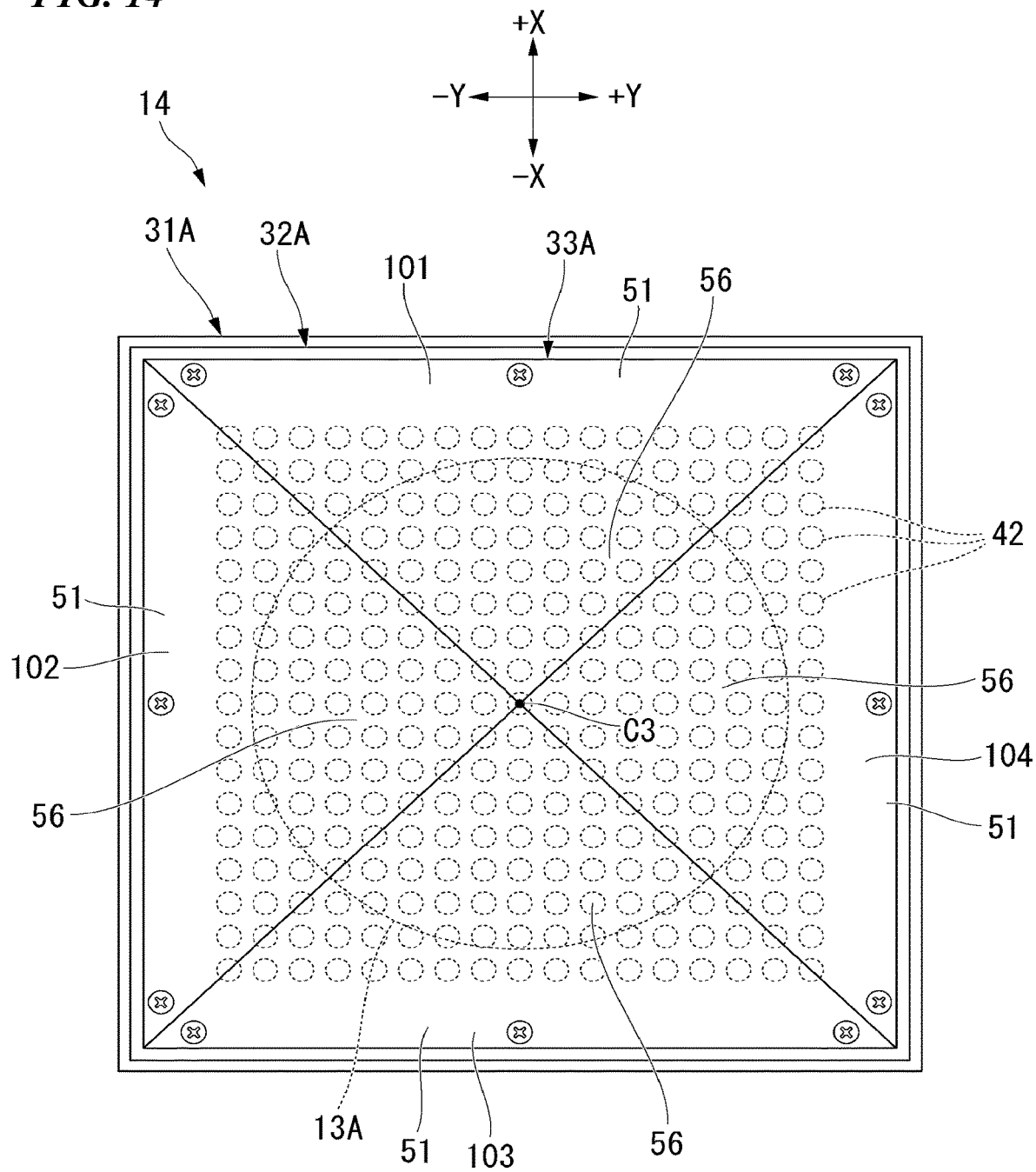
FIG. 14 is a plan view showing a part of a power conversion device according to a modified example of the first to sixth embodiments.

Next, a modified example of the power conversion device 1 according to the first to sixth embodiments will be described. FIG. 14 is a plan view showing a part of the power conversion device 1 according to a modified example. In the modified example, the first shutter 33A is cut by four lines which connect the center C3 of the first shutter 33A and each of the corners and is divided into four shutter pieces 101, 102, 103, and 104. Each of the shutter pieces 101, 102, 103, and 104 has the first end portion (a fixed end portion) 51 and the movable portion 56. The first end portion 51 is fixed to at least one of the housing 11 and the frame bodies 31A and 31B (or the frame body 31). Also, with such a constitution, the same effects as those of the above-described embodiment can be obtained.

As described above, although the first to sixth embodiments and the modified example have been described, the embodiments are not limited to the above-described examples. The constitutions of the first to sixth embodiments may be realized in combination with each other. Further, the shutters 33A and 33B and the panels 32A and 32B are not limited to those provided above the housing 11 and may be provided on the lateral side of the housing 11. The panels 32A and 32B may be disposed inside the frame bodies 31A and 31B or between the frame bodies 31A and 31B and the upper wall 11f of the housing 11, instead of between the frame bodies 31A and 31B and the shutters 33A and 33B. Further, the panels 32A and 32B may be attached to the housing 11 in which the frame bodies 31A and 31B are not provided. Further, the panels 32A and 32B may be omitted. The flow guide plates 34A and 34B may be omitted. The plurality of exhaust holes 42 may be provided not to be biased at an end portion of one of the panels 32A and 32B. Furthermore, the mesh member may be installed in the housing 11 in which the frame bodies 31A and 31B are not provided.

According to at least one of the above-described embodiments, the power conversion device includes a flexible shutter. The shutter is in a sheet shape. The shutter includes an end portion which is fixed to at least one of the housing and the frame body, and a movable portion which is movable with respect to the housing. The shutter is deformed by the wind from the fan in a case where the fan is driven and forms a gap through which the wind passes between the shutter and at least one of the housing and the frame body. According to such a constitution, the shutter can be easily operated as designed over a long period of time.

Although several embodiments of the present invention have been described, these embodiments are provided as examples and are not intended to limit the scope of the invention. The embodiments can be implemented in various other forms, and various omissions, replacements and changes can be made without departing from the spirit of the invention. The embodiments and the modifications thereof are included in the scope and gist of the invention and are also included in the invention described in the claims and the equivalents thereof.

EXPLANATION OF REFERENCES

1 Power conversion device
11 Housing
12 Power conversion unit
13A, 13B Fan
31, 31A, 31B Frame body
32A, 32B Panel
33A, 33B Shutter
34A, 34B Flow guide plate
41 Exhaust port of frame body
42 Exhaust hole of panel
42a First hole
51 First end portion
52 Second end portion
53 Third end portion
54 Fourth end portion
56 Movable portion
C1 Rotation center axis of fan
S Gap
F1, F2 Main flow direction of wind

The invention claimed is:

1. A power conversion device comprising:
a housing;
a power conversion unit accommodated in the housing:
a frame body attached to the housing;
a first fan accommodated in at least one of: the housing or the frame body, the first fan being configured to exhaust air in the housing to an outside of the housing:
a first shutter which is flexible and in a sheet shape, the first shutter being disposed outside the housing and configured to cover the first fan, the first shutter including a first end portion and a movable portion, the first end portion being fixed to at least one of the housing and the frame body, the movable portion being movable with respect to the housing, the first shutter being configured to be deformed by wind from the first fan in a case that the first fan is driven and to form a gap through which the wind passes between the first shutter and at least one of the housing and the frame body; and
a flow guide plate accommodated in the frame body,
wherein
the first shutter includes a second end portion, a first region, and a second region, the second end portion being located on a side opposite to the first end portion, the first region being between a center of the first shutter and the first end portion, the second region being located between the center of the first shutter and the second end portion, and
the flow guide plate includes an inclined portion inclined with respect to a rotation center axis of the first fan, the flow guide being configured to change, toward the second region of the first shutter, a flow direction of at least some of the wind from the first fan.

2. The power conversion device according to claim 1, wherein
the first fan is configured to send the wind toward a side above the housing, and
the first shutter is configured to be disposed substantially horizontally above the housing and to form the gap by the movable portion being lifted upward by the wind.

3. The power conversion device according to claim 2, wherein
the frame body includes an exhaust port which faces upward, and
the first shutter is disposed outside the frame body and configured to cover the exhaust port from above in a case that the first fan is not driven.

4. The power conversion device according to claim 3, further comprising:
a mesh member,
wherein the mesh member is accommodated in the frame body and located between the first fan and the first shutter.

5. The power conversion device according to claim 2, further comprising:
a panel between the first fan and the first shutter, the panel including a plurality of exhaust holes.

6. The power conversion device according to claim 5, wherein
the panel is configured to support the first shutter on the panel in a substantially horizontal posture in a case that the first fan is not driven.

7. The power conversion device according to claim further comprising:
a second fan accommodated in at least one of: the housing or the frame body, the second fan being configured to exhaust the air in the housing to the outside of the housing, and
a second shutter which is flexible and in a sheet shape, the second shutter including a first end portion and a movable portion, the first end portion being fixed to at least one of the housing and the frame body, the movable portion being movable with respect to the housing, the second shutter being configured to be deformed by wind from the second fan in a case that the second fan is driven and to form a gap through which the wind passes between the second shutter and at least one of the housing and the frame body,
wherein
the first shutter and the second shutter are disposed side by side, and
arrangement positions of the first end portion of the first shutter and the first end portion of the second shutter are set so that a main flow direction of the wind exhausted from the gap formed by the first shutter is a direction from the first shutter toward a side above the second shutter and a main flow direction of the wind exhausted from the gap formed by the second shutter is a direction toward a side opposite to the first shutter.

8. The power conversion device according to claim 1, further comprising:
a second fan accommodated in at least one of: the housing or the frame body, the second fan being configured to exhaust the air in the housing to the outside of the housing, and
a second shutter which is flexible and in a sheet shape, the second shutter including a first end portion and a movable portion, the first end portion being fixed to at least one of the housing and the frame body, the movable portion being movable with respect to the housing, the second shutter being configured to be deformed by wind from the second fan in a case that the second fan is driven and to form a gap through which the wind passes between the second shutter and at least one of the housing and the frame body,
wherein
the first shutter and the second shutter are disposed side by side, and
arrangement positions of the first end portion of the first shutter and the first end portion of the second shutter are set so that a main flow direction of the wind exhausted from the gap formed by the first shutter and a main flow direction of the wind exhausted from the gap formed by the second shutter are different directions which do not face each other.

9. A power conversion device comprising:
a housing;
a power conversion unit accommodated in the housing:
a first fan accommodated in at least one of; the housing or a frame body attached to the housing, the first fan being configured to exhaust air in the housing to an outside of the housing;
a first shutter which is flexible and in a sheet shape, the first shutter being disposed outside the housing and configured to cover the first fan, the first shutter including a first end portion and a movable portion, the first end portion being fixed to at least one of the housing and the frame body, the movable portion being movable with respect to the housing, the first shutter being configured to be deformed by wind from the first fan in a case that the first fan is driven and to form a gap through which the wind passes between the first shutter and at least one of the housing and the frame body; and
a panel between the first fan and the first shutter, the panel including a plurality of exhaust holes,
wherein
the first shutter includes a second end portion located on a side opposite to the first end portion, and
the plurality of exhaust holes is disposed closer to the second end portion of the first shutter than to the first end portion of the first shutter.

10. A power conversion device comprising:
a housing;
a power conversion unit accommodated in the housing;
a first fan accommodated in at least one of: the housing or a frame body attached to the housing, the first fan being configured to exhaust air in the housing to an outside of the housing;
a first shutter which is flexible and in a sheet shape, the first shutter being disposed outside the housing and configured to cover the first fan, the first shutter including a first end portion and a movable portion, the first end portion being fixed to at least one of the housing and the frame body, the movable portion being movable with respect to the housing, the first shutter being configured to be deformed by wind from the first fan in a case that the first fan is driven and to form a gap through which the wind passes between the first shutter and at least one of the housing and the frame body; and
a panel between the first fan and the first shutter, the panel including a plurality of exhaust holes,
wherein
the first shutter includes a second end portion located on a side opposite to the first end portion,
the plurality of exhaust holes include a first hole closest to the second end portion of the first shutter among the plurality of exhaust holes, and
the first shutter has a size in which the second end portion remains on a side opposite to the first end portion with respect to the first hole in a state in which the first fan is driven at a maximum rated output and the first shutter is deformed by the wind.

* * * * *